United States Patent
Liang (10) Patent No.: US 9,984,955 B1
(45) Date of Patent: May 29, 2018

(54) LIGHTWEIGHT LIQUID-COOLING-PLATE ASSEMBLY HAVING PLASTIC FRAME AND HEAT DISSIPATION SYSTEM USING SAME

(71) Applicant: ENZOTECHNOLOGY CORP., Chino, CA (US)

(72) Inventor: Kuo-An Liang, Taoyuan (TW)

(73) Assignee: ENZOTECHNOLOGY CORP., Chino, CA (US)

( * ) Notice: Subject to any disclaimer, the term of this patent is extended or adjusted under 35 U.S.C. 154(b) by 0 days. days.

(21) Appl. No.: 15/391,651

(22) Filed: Dec. 27, 2016

(30) Foreign Application Priority Data

Nov. 25, 2016 (TW) .............................. 105218014 U (51) Int. Cl.
| | |
|---|---|
| H05K 7/20 | (2006.01) |
| H01L 23/473 | (2006.01) |
| F28F 9/00 | (2006.01) |
| F28F 21/06 | (2006.01) |
| F28F 9/26 | (2006.01) |
| H01L 23/40 | (2006.01) |

(52) U.S. Cl.
CPC ............ H01L 23/473 (2013.01); F28F 9/001 (2013.01); F28F 9/002 (2013.01); F28F 9/266 (2013.01); F28F 21/065 (2013.01); H01L 23/4006 (2013.01); H05K 7/20254 (2013.01); F28F 2275/025 (2013.01); H01L 2023/4025 (2013.01); H01L 2023/4037 (2013.01); H01L 2023/4087 (2013.01)

(58) Field of Classification Search
None
See application file for complete search history.

(56) References Cited

U.S. PATENT DOCUMENTS

| | | | | |
|---|---|---|---|---|
| 6,213,195 B1* | 4/2001 | Downing | ................ | H01L 23/46 165/80.4 |
| 6,434,003 B1* | 8/2002 | Roy | .................... | H05K 7/20927 165/104.22 |
| 7,173,823 B1* | 2/2007 | Rinehart | ............... | F28D 9/0031 165/80.4 |
| 9,666,504 B2* | 5/2017 | Abeyasekera | .......... | H01L 23/34 |
| 2006/0092611 A1* | 5/2006 | Beihoff | .................... | B60L 11/12 361/698 |
| 2007/0230127 A1* | 10/2007 | Peugh | ................... | H01L 23/053 361/699 |
| 2008/0174393 A1* | 7/2008 | Schnetzka | ............. | F25B 49/025 336/57 |
| 2010/0277868 A1* | 11/2010 | Beaupre | ................ | H01L 23/473 361/700 |

(Continued)

*Primary Examiner* — Courtney Smith
(74) *Attorney, Agent, or Firm* — Kirton McConkie; Evan R. Witt (57) ABSTRACT

The present invention relates to a lightweight liquid-cooling-plate assembly having a plastic frame and a heat dissipation system using the same. The liquid-cooling-plate assembly includes a plastic frame and at least one coolant chamber unit. The plastic frame includes a plurality of lateral walls, at least one accommodation opening, and a plurality of fastening elements. The lateral walls are connected with each other to form and define the at least one accommodation opening. The fastening elements are disposed on a part of the lateral walls. The coolant chamber unit is connected with the plastic frame and embedded in the at least one accommodation opening, and includes at least one surface exposed.

18 Claims, 11 Drawing Sheets

(56) References Cited

U.S. PATENT DOCUMENTS

| | | | |
|---|---|---|---|
| 2014/0268571 A1* | 9/2014 | Kang | H05K 7/20 |
| | | | 361/699 |
| 2016/0183409 A1* | 6/2016 | Zhou | H05K 7/20281 |
| | | | 361/699 |

* cited by examiner

LIGHTWEIGHT LIQUID-COOLING-PLATE ASSEMBLY HAVING PLASTIC FRAME AND HEAT DISSIPATION SYSTEM USING SAME

FIELD OF THE INVENTION

The present invention relates to a liquid-cooling-plate assembly and a heat dissipation system, and more particularly to a lightweight liquid-cooling-plate assembly having a plastic frame and a heat dissipation system using the same.

BACKGROUND OF THE INVENTION

In recent years, the developments of electronic devices trend toward miniaturization and integration, and the power of the electronic device is increased continuously. As a result, the heat flux density of electronic device is becoming higher and higher, and the heat dissipation efficiency is hard to be enhanced. The electronic devices such as the insulated gate bipolar transistors (IGBT) of power semiconductor devices are widely used as a high-frequency switch element for various power supply systems. The high power semiconductor device generates a large amount of heat during operating. If the generated heat can't be removed effectively, the entire system may be damaged or the operation efficiency may be reduced. However, the passive heat dissipation devices fail to meet the heat dissipation requirements of high power semiconductor devices. Comparing to the passive heat dissipation devices, the liquid-cooled-plate assembly has better performance and can meet the heat dissipation requirements or package footprint requirements.

Currently, there are many implementations of liquid-cooling-plate assemblies applied in power semiconductor devices. The most common liquid-cooling-plate assembly includes a metal plate with a flow path, where the power semiconductor devices are mounted on the surface of the metal plate. Heat exchange is carried out between the liquid flowing in the internal flow path of the metal plate and the power semiconductor devices. Consequently, the heat is transferred from the system to the surrounding to achieve heat dissipation of the power semiconductor devices.

Figure 1:
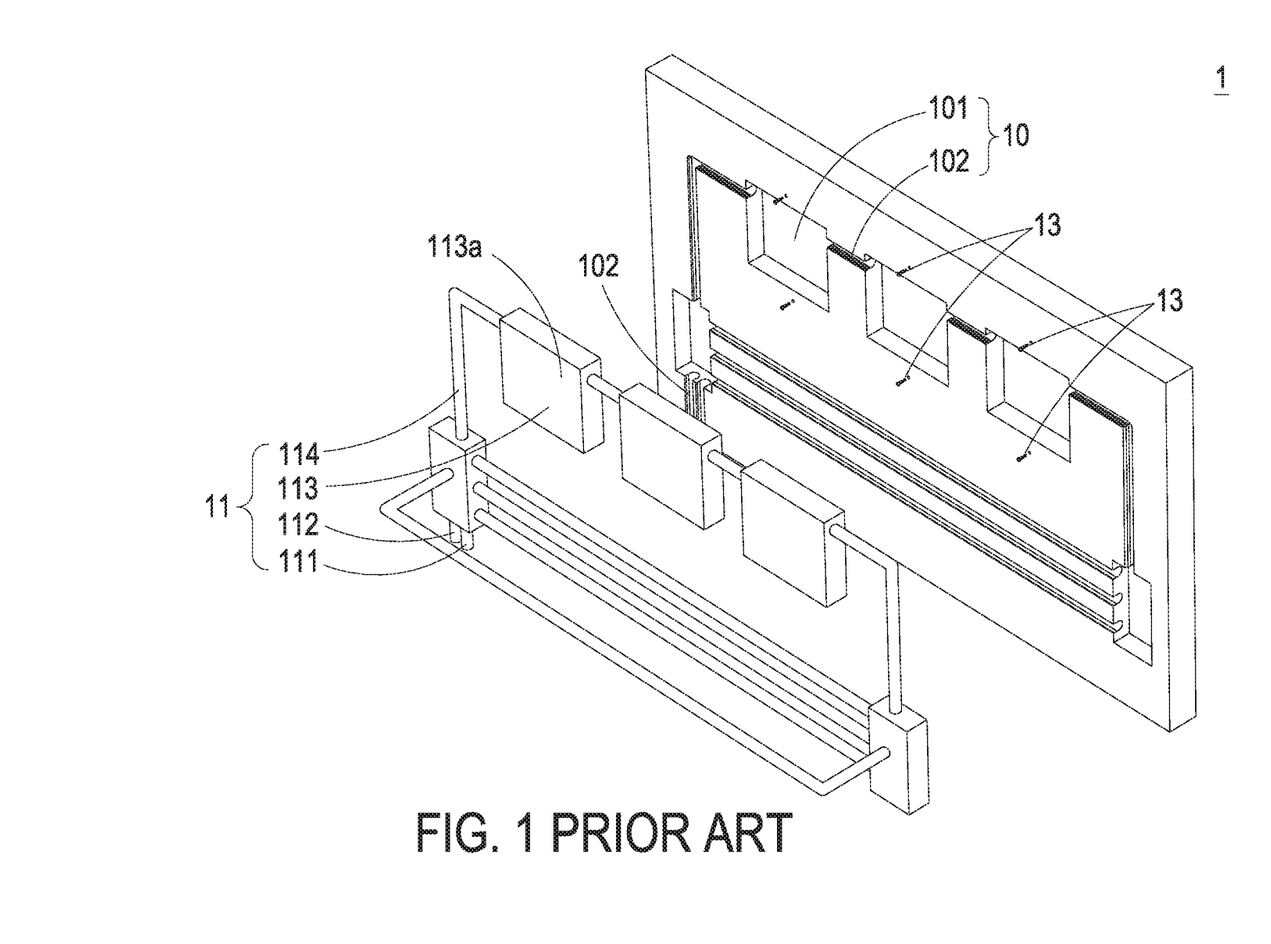
FIG. 1 is a schematic view illustrating a conventional liquid-cooling-plate assembly.

FIG. 1 is a schematic view illustrating a conventional liquid-cooling-plate assembly. The liquid-cooling-plate assembly 1 includes a metal plate 10 and a coolant flow channel module 11. The metal plate 10 includes a plurality of through-openings 101 and a plurality of grooves 102. The coolant flow channel module 11 includes at least one fluid inlet 111, at least one fluid outlet 112, a plurality of coolant chamber units 113, and a plurality of fluid ducts 114. The coolant chamber units 113 are communicated with each other through the fluid ducts 114 and further communicated between the fluid inlet 111 and the fluid outlet 112, so that the fluid inlet 111, the fluid outlet 112, the coolant chamber units 113 and the fluid ducts 114 are configured to form at least one flow path. The through-openings 101 and the grooves 102 of the metal plate 10 are corresponding to the coolant chamber units 113, the fluid ducts 114, the fluid inlet 111 and the fluid outlet 112 of the coolant flow channel module 11 respectively, so that the coolant chamber units 113, the fluid ducts 114, the fluid inlet 111 and the fluid outlet 112 of the coolant flow channel module 11 are received in the through-openings 101 and the grooves 102 of the metal plate 10. The surfaces 113a of the coolant chamber units 113 are exposed and positioned on the metal plate 10. In addition, the power semiconductor devices (not shown) are directly secured to the metal plate 10 by means of screws 13, and are attached to the surfaces 113a of the coolant chamber units 113 so as to achieve heat dissipation. However, the metal plate 10 is made of a metal material, which is a heavy-weight and high-cost material, and liable to cause an excessive load for the entire system while the metal plate 10 is fixed to the system. In addition, the through-openings 101 and the grooves 102 of the metal plate 10 are produced and formed by precision metal drilling and slotting processing, which result in a severe producing process and high cost. Furthermore, the positioning and assembling of the coolant flow channel module 11 and the metal plate 10 can't be accomplished easily, and the assembling process is time-consuming.

Figure 2:
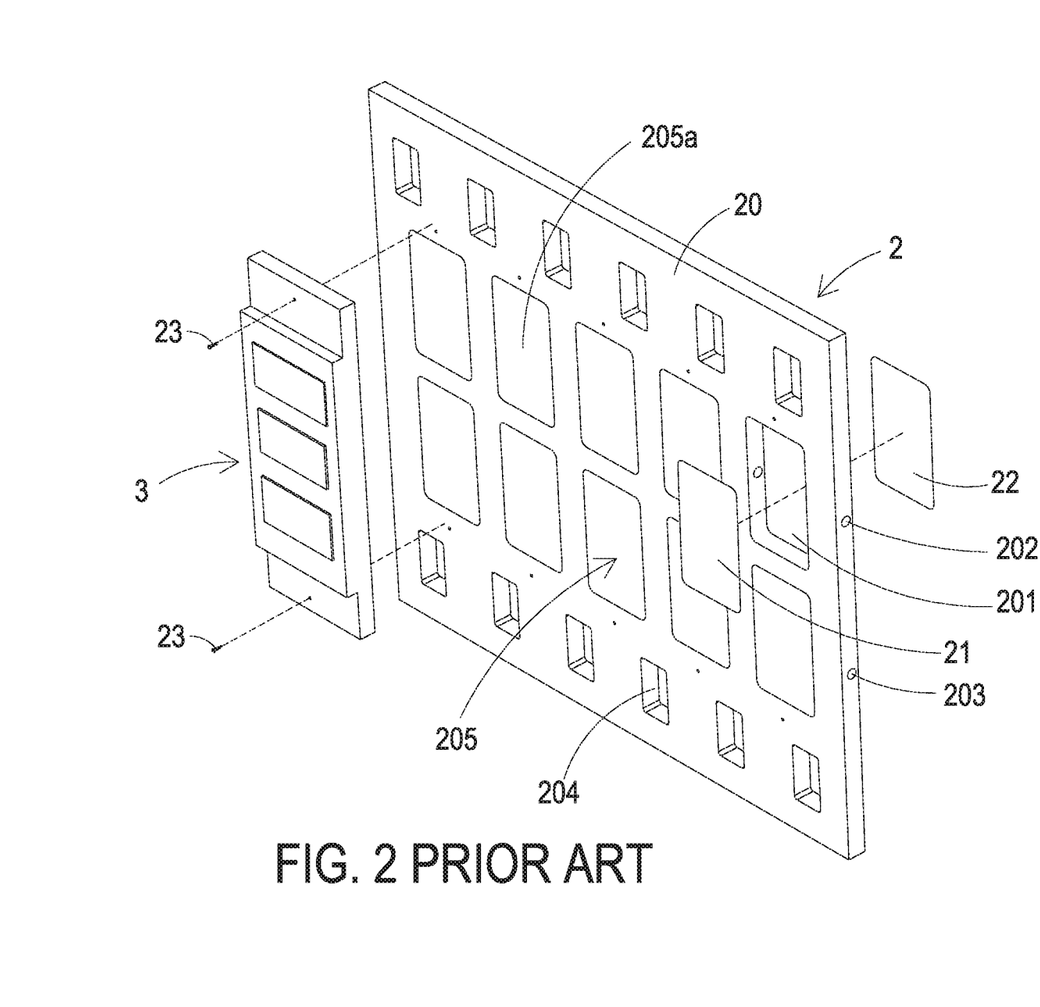
FIG. 2 is a schematic view illustrating another conventional liquid-cooling-plate assembly.

FIG. 2 is a schematic view illustrating another conventional liquid-cooling-plate assembly. The liquid-cooling-plate assembly 2 includes a metal plate 20, a plurality of first metal sheets 21 and a plurality of second metal sheets 22. The metal plate 20 includes a plurality of coolant chambers 201, a plurality of embedded fluid ducts (not shown), at least one fluid inlet 202, at least one fluid outlet 203 and a plurality of through-openings 204. The first metal sheets 21 and the second metal sheets 22 are disposed at and corresponding to two opposite openings of the coolant chambers 201, so that the first metal sheets 21 and the second metal sheets 22 are configured to seal the corresponding coolant chambers 201 and form a plurality of coolant chamber units 205. The coolant chamber units 205 are communicated with each other through the embedded fluid ducts, and communicated between the fluid inlet 202 and the fluid outlet 203, so that the fluid inlet 202, the fluid outlet 203, the coolant chamber units 205 and the embedded fluid ducts are configured to form at least one flow path. The surfaces 205a of the coolant chamber units 205 are exposed and positioned on the metal plate 20. In addition, the power semiconductor device 3 is directly secured to the metal plate 20 by means of screws 23 and attached to the surfaces 205a of the coolant chamber units 205, so as to achieve heat dissipation. However, the metal plate 20 is made of a metal material, which is a heavy-weight and high-cost material, and liable to cause an excessive load for the entire system while the metal plate 20 is fixed to the system. Although the metal plate 20 is provided with the through-openings 204 to reduce the weight of the metal plate 20, the overall weight of the metal plate 20 is still heavy. In addition, the through-openings 204 of the metal plate 20 are formed by a precision metal drilling process and the coolant chamber units 205 are formed by welding the first metal sheets 21 and the second metal sheets 22 to the metal plate 20, which also results in a severe producing process and high cost.

Therefore, there is a need of providing a liquid-cooling-plate assembly and a heat dissipation system to overcome the above drawbacks.

SUMMARY OF THE INVENTION

The object of the present disclosure is to provide a lightweight liquid-cooling-plate assembly having a plastic frame and a heat dissipation system using the liquid-cooling-plate assembly. The plastic frame is combined with at least one coolant chamber unit to form the liquid-cooling-plate assembly, so as to provide sufficient mechanical strength for supporting the coolant chamber unit. In addition, the power semiconductor devices can be secured on the liquid-cooling-plate assembly, or the liquid-cooling-plate assembly can be assembled with a system board so as to achieve the purpose of cooling and lightweight.

Another object of the present disclosure is to provide a lightweight liquid-cooling-plate assembly having a plastic frame and a heat dissipation system using the liquid-cooling-plate assembly. The plastic frame is preformed and then assembled with the coolant chamber unit, or the plastic frame body can be formed and combined with the coolant chamber unit directly by means of injection molding or matrix transfer molding, so that the liquid-cooling-plate assembly is lightened, has lower material cost, and can be assembled easily. The production rate is increased, and the assembly cost is reduced.

In accordance with an aspect of the present disclosure, a liquid-cooling-plate assembly is provided and includes a plastic frame and at least one coolant chamber unit. The plastic frame includes a plurality of lateral walls, at least one accommodation opening, and a plurality of fastening elements. The lateral walls are connected with each other to form and define the at least one accommodation opening. The fastening elements are disposed on a part of the lateral walls. The coolant chamber unit is connected with the plastic frame and embedded in the at least one accommodation opening, and includes at least one surface exposed.

In accordance with another aspect of the present disclosure, there is provided a heat dissipation system. The heat dissipation system includes a liquid-cooling-plate assembly, at least one power semiconductor module and a system board. The liquid-cooling-plate assembly includes a plastic frame and at least one coolant chamber unit. The plastic frame includes a plurality of lateral walls, at least one accommodation opening, and a plurality of fastening elements. The lateral walls are connected with each other to form and define the at least one accommodation opening, and the fastening elements are disposed on a part of the lateral walls. The at least one coolant chamber unit is connected with the plastic frame and embedded in the at least one accommodation opening, and includes at least one surface exposed. The at least one power semiconductor module is secured on the plastic frame of the liquid-cooling-plate assembly by allowing a plurality of first securing elements to engage with a part of the fastening elements. The at least one power semiconductor module is attached on the at least one surface of the liquid-cooling-plate assembly. The system board is assembled with the liquid-cooling-plate assembly by allowing a plurality of second securing elements to engage with the other part of the fastening elements.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 3:
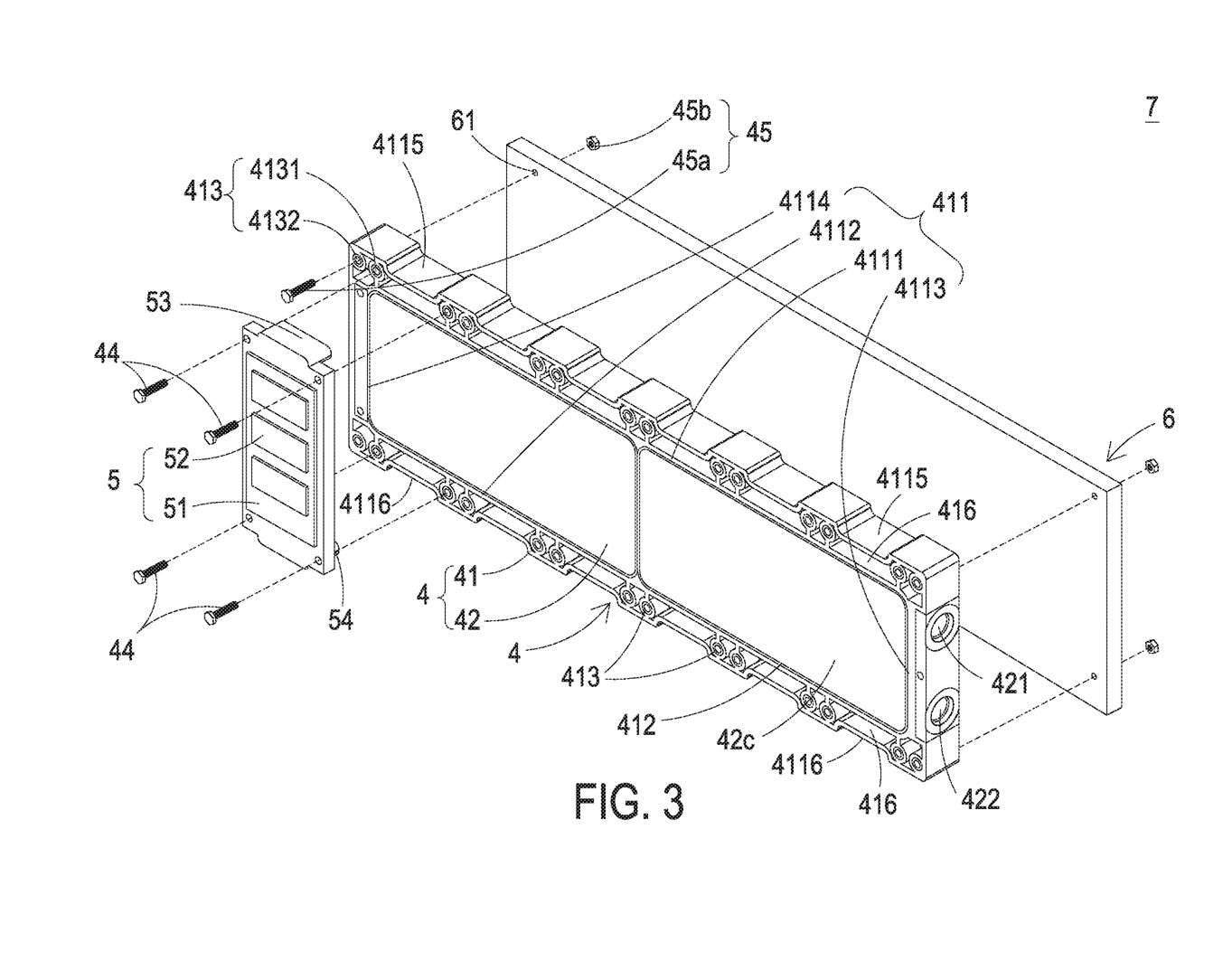
FIG. 3 is a schematic perspective view illustrating a heat dissipation system and a liquid-cooling-plate assembly according to a first embodiment of the present invention.
Figure 4:
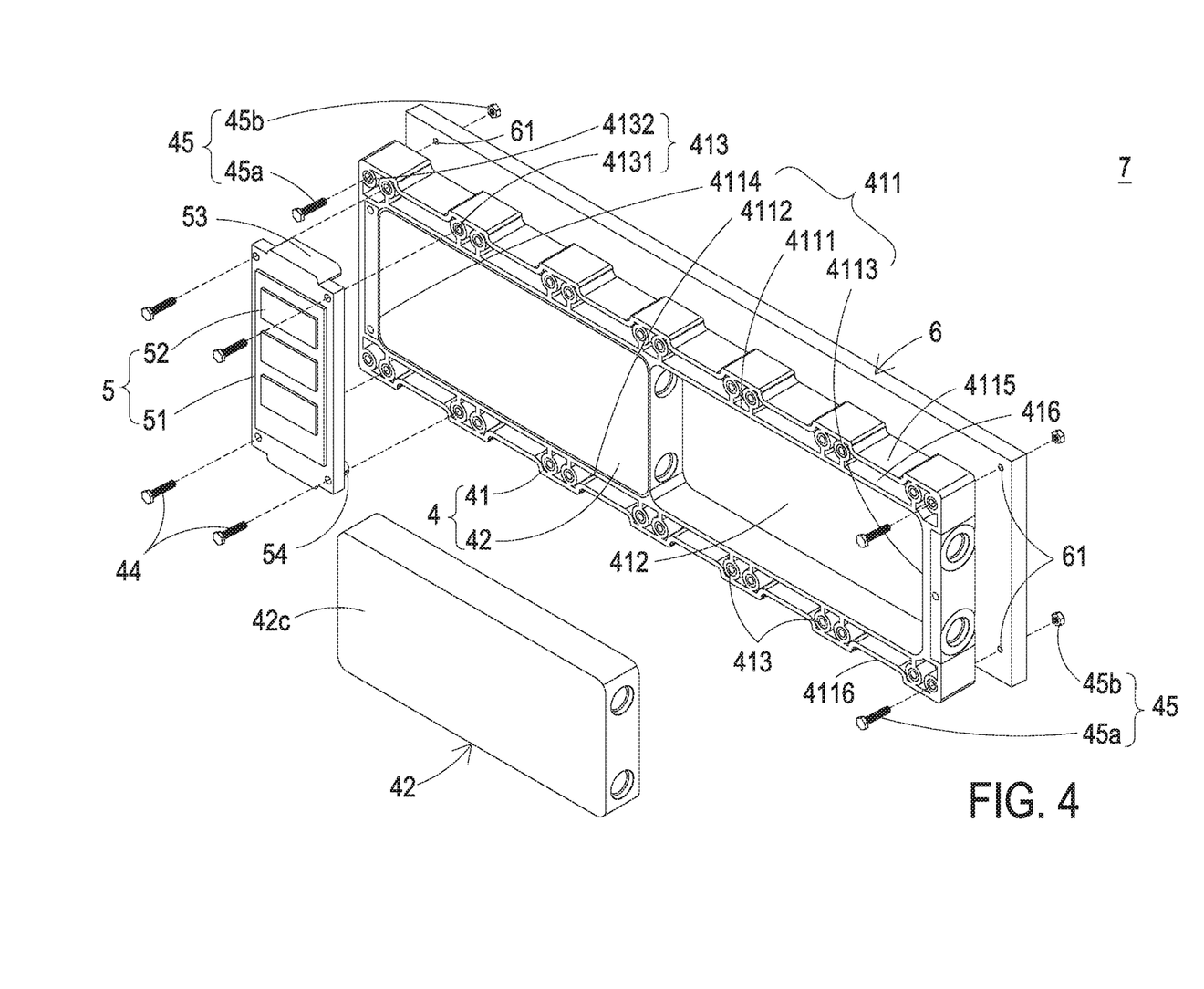
FIG. 4 is an exploded views illustrating the liquid-cooling-plate assembly of FIG. 3.

FIG. 3 is a schematic perspective view illustrating a heat dissipation system and a liquid-cooling-plate assembly according to a first embodiment of the present invention, and FIG. 4 is an exploded vies illustrating the liquid-cooling-plate assembly of FIG. 3. As shown in FIGS. 3 and 4, the heat dissipation system 7 of the present invention includes a liquid-cooling-plate assembly 4, at least one power semiconductor module 5 and a system board 6. The liquid-cooling-plate assembly 4 includes a plastic frame 41 and at least one coolant chamber unit 42. The plastic frame 41 includes a plurality of lateral walls 411, at least one accommodation opening 412, and a plurality of fastening elements 413. The lateral walls 411 are connected with each other to form and define the at least one accommodation opening 412. The fastening elements 413 are disposed on a part of the lateral walls 411. The coolant chamber unit 42 is connected with the plastic frame 42 and embedded in the accommodation opening 412. The coolant chamber unit 42 further includes at least one surface 42c exposed and used as a heat dissipation contact surface.

Figure 5:
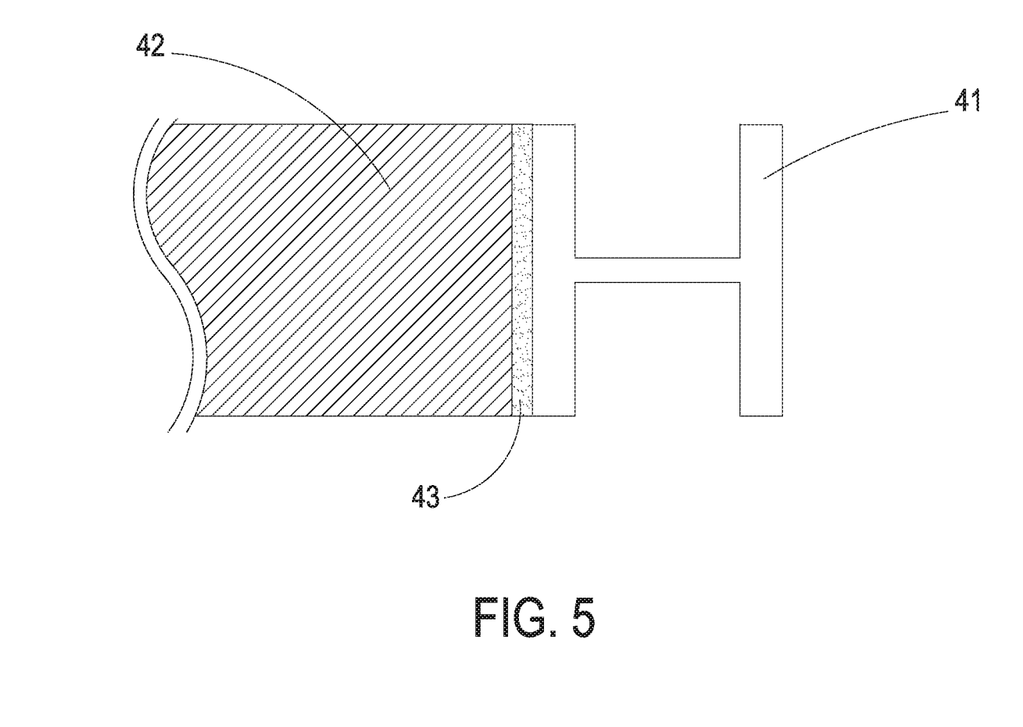
FIG. 5 is a cross sectional view illustrating the connection between the plastic frame and the coolant chamber unit of the present invention.

In the embodiment, the plastic frame 41 is preformed, and connected with the coolant chamber unit 42 by an adhesive layer 43, as shown in FIG. 5. In another embodiment, the plastic frame 41 is formed by means of injection molding or matrix transfer molding and assembled with the coolant chamber unit 42 directly. In the embodiment, the lateral walls 411 of the plastic frame 41 have at least portion of inner sides connected to the outer edge of the coolant chamber 42. In the embodiment, the lateral walls 411 of the plastic frame 41 includes a first lateral wall 4111, a second lateral wall 4112, a third lateral wall 4113 and a fourth lateral wall 4114. The first lateral wall 4111, the second lateral wall 4112, the third lateral wall 4113 and the fourth lateral wall 4114 are connected with each other to form and define the accommodation openings 412. The first lateral wall 4111 is opposite to the second lateral wall 4112. The third lateral wall 4113 is opposite to the fourth lateral wall 4114. The first lateral wall 4111 includes two ends connected with the third lateral wall 4113 and the fourth lateral wall 4114 respectively. The second lateral wall 4112 includes two ends connected with the third lateral wall 4113 and the fourth lateral wall 4114 respectively. In other embodiments, the lateral walls 411 of the plastic frame 41 can be modified according to the outer profile of the coolant chamber unit 42.

The plastic frame 41 has good processing performance and perfect connection with the coolant chamber unit 42 by means of injection molding or matrix transfer molding, and allows the surface 42c, which serves as a heat dissipation contact surface, to be exposed sufficiently. Certainly, the connection among the foregoing lateral walls 411 including the first lateral wall 4111, the second lateral wall 4112, the third lateral wall 4113 and the fourth lateral wall 4114 are illustrated for showing the embodiments merely. According to the concept of the present invention, the coolant chamber unit 42 with any outer profile can be combined with a plurality of lateral walls 411 of the plastic frame 41 so as to provide sufficient mechanical strength for supporting the structure. The present invention is not limited to the above-mentioned embodiment and can be varied according to the practical requirements.

In the embodiment, the coolant chamber unit 42 is made of a metallic material. The coolant chamber unit 42 includes at least one fluid inlet 421, at least one fluid outlet 422 and at least one internal flow path (not shown). The internal flow path of the coolant chamber unit 42 is communicated with the fluid inlet 421 and the fluid outlet 422. The coolant chamber unit 42 further includes the cooling liquid imported from the fluid inlet 421, flowing through the internal flow path and then exported from the fluid outlet 422, so that the heat from the power semiconductor module 5 is transferred through the cooling liquid and the surface 42c of the coolant chamber unit 42 to achieve the heat dissipation. In the embodiment, the cooling liquid is for example but not limited to water or other refrigerant fluid.

Figure 6A:
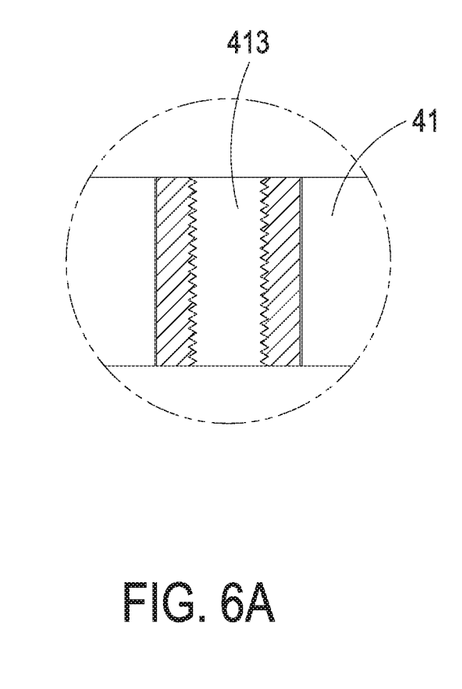
FIGS. 6A and 6B are cross sectional views illustrating the fastening elements of the plastic frame according to two different embodiments.
Figure 6B:
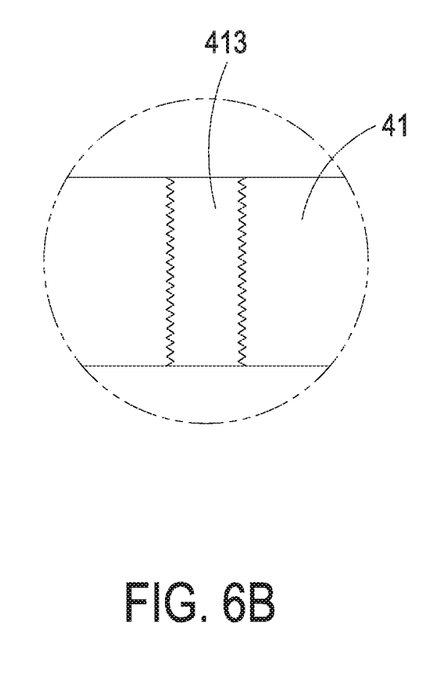

In the embodiment, the fastening elements 413 are disposed and embedded in the first lateral wall 4111 and the second lateral wall 4112. The number and the positions of the fastening elements 413 disposed in the first lateral wall 4111 are corresponding to the number and the positions of the fastening elements 413 disposed in the second lateral wall 4112. The fastening element 413 is for example but not limited to a pillar with threaded hole, which pass through two opposite edges of first lateral wall 4111 or two opposite edges of second lateral wall 4112. The fastening elements 413 can be formed by inserting the pillars with threaded hole into the plastic frame 41 after the plastic frame 41 is formed, or embedding pillars with threaded holes in the plastic frame 41 during injection molding process, as shown in FIG. 6A. In other embodiment, the fastening elements 413 are threaded holes, which are formed by inserting self-tapping screws into the first lateral wall 4111 and the second lateral wall 4112 of the plastic frame 41 directly and then removing the self-tapping screws out of the plastic frame 41, as shown in FIG. 6B. It is noted that forming methods of the foregoing fastening elements 413 aren't limited to the above embodiment and can be adjusted and modified according to the practical requirements. In this embodiment, the plastic frame 41 is made of an engineering plastic material having mechanical strength and excellent machinability. The density of the engineering plastic material is lower than the densities of metal materials, such as aluminum, copper, iron, stainless steel, and the like. The plastic frame 41 has sufficient mechanical strength to support the coolant chamber unit 42 and is provided with the fastening elements 413. Consequently, the power semiconductor module 5 can be secured on the liquid-cooling-plate assembly 4 via the fastening elements 413 or the liquid-cooling-plate assembly 4 can be secured on the system board 6 via the fastening elements 413. In some embodiments, the fastening elements 413 disposed on the first lateral wall 4111 are configured in pairs, and each two adjacent pairs thereof are spaced apart at equal intervals. The fastening elements 413 disposed on the second lateral wall 4112 are configured in pairs, and each two adjacent pairs thereof are spaced apart at equal intervals. In some embodiments, the fastening elements 413 includes a plurality of first fastening elements 4131 and a plurality of second fastening elements 4132. The first fastening elements 4131 are configured to secure at least one power semiconductor module 5 on the liquid-cooling-plate assembly 4, and the second fastening elements 4132 are configured to secure the liquid-cooling-plate assembly 4 to a system board 6. The second fastening elements 4132 are located at two opposite ends of the first lateral wall 4111 and two opposite ends of the second lateral wall 4112 of the plastic frame 41. Namely, the second fastening elements 4132 are located at four corners of the plastic frame 41. The first fastening elements 4131 are located between the two second fastening elements 4132 disposed on the first lateral wall 4111 or located between the two second fastening elements 4132 disposed on the second lateral wall 4112.

Please refer to FIG. 3. The power semiconductor module 5 is secured on the plastic frame 41 by a plurality of first securing elements 44, for example but not limited to screws, which pass though the through-holes of the power semiconductor module 5 firstly and then are secured to the corresponding first fastening elements 4131 of the plastic frame 41. Consequently, the power semiconductor module 5 is fixed on the liquid-cooling-plate assembly 4 and attached onto the surface 42c of the coolant chamber unit 42 for facilitating the liquid-cooling-plate assembly 4 to efficiently transfer the heat generated from the power semiconductor module 5 during operating. On the other hand, the liquid-cooling-plate assembly 4 combined with the power semiconductor module 5 is secured on the system board 6 by a plurality of second securing elements 45. Each of the second securing elements 45 includes for example but not limited to a screw 45a and a nut 45b. The screw 45a is configured to pass through the corresponding second fastening element 4132 of the plastic frame 41 and the corresponding through hole 61 of the system board 6, and then engage with the nut 45b. Consequently, the liquid-cooling-plate assembly 4 is secured on the system board 6. In the embodiment, the first fastening elements 4131 and the second fastening elements 4132 have the same structure, and the number and positions of the first fastening elements 4131 and the second fastening elements 4132 are adjustable and modified according to the practical requirements.

In some embodiments, the first lateral wall 4111 of the plastic frame 41 includes a plurality of first position recesses 4115 disposed on the outer side thereof. The second lateral wall 4112 of the plastic frame 41 includes a plurality of second position recesses 4116 disposed on the outer side thereof. The first position recesses 4115 are aligned with the second position recesses 4116. The power semiconductor module 5 includes a carrier 51 and at least one power semiconductor device 52. The power semiconductor device 52 is disposed on the carrier 51. The carrier 51 includes a first position protrusion 53 and a second position protrusion 54. The first position recesses 4115 are configured to match with the first position protrusion 53, and the second position recesses 4116 are configured to match with the second position protrusion 54. Consequently, the alignments between through-holes of the power semiconductor module 5 and the corresponding first fastening elements 4131 are achieved by using the position recesses and the position protrusions so as to facilitate the fastening operation of the first securing elements 44. In some embodiments, the plastic frame 41 is provided with a plurality of grooves 416 without affecting the structural strength of the plastic frame 41. Consequently, the weight of the plastic frame 41 can be reduced to accomplish the purpose of lightweight.

Figure 7:
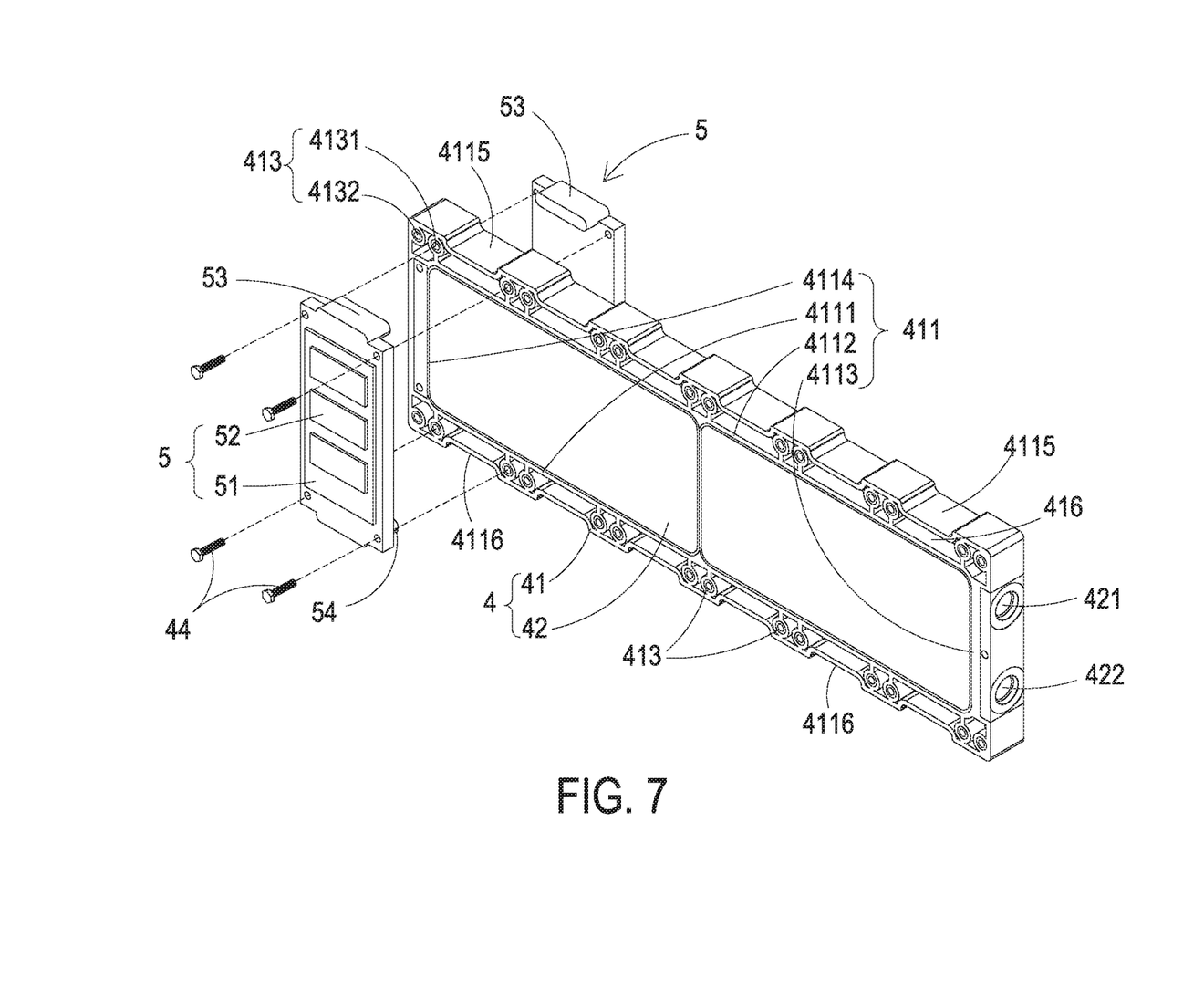
FIG. 7 is a schematic perspective view illustrating another variation of the heat dissipation system shown in FIG. 3.

In some embodiments, as shown in FIG. 7, the coolant chamber unit 42 of the liquid-cooling-plate assembly 4 has two opposite surfaces exposed so that two power semiconductor device modules 5 can be respectively secured on the liquid-cooling-plate assembly 4 and attached to the two opposite surfaces of the coolant chamber unit 41. Consequently, the heat dissipation system 7 is densified and the utilization of the liquid-cooling-plate assembly 4 is enhanced.

Figure 8:
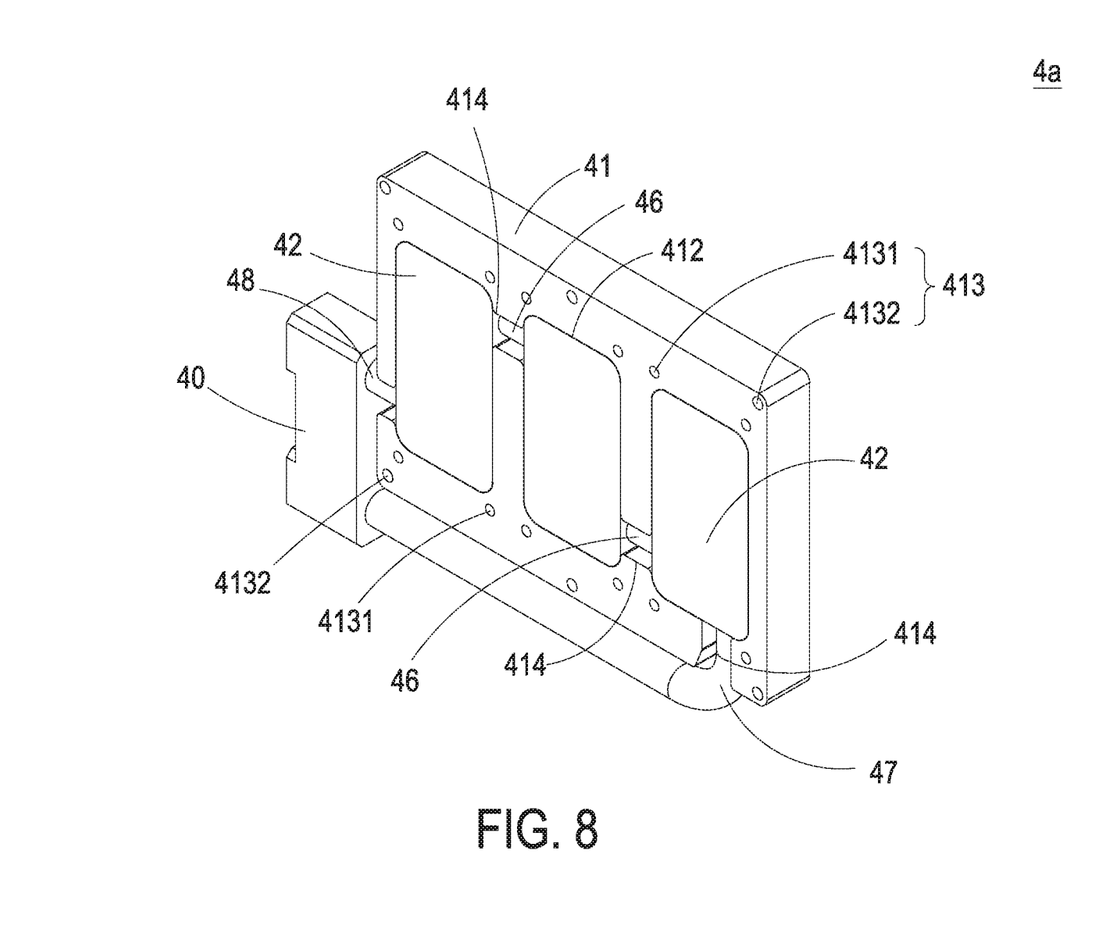
FIG. 8 is a schematic perspective view illustrating a liquid-cooling-plate assembly according to a second embodiment of the present invention.
Figure 9:
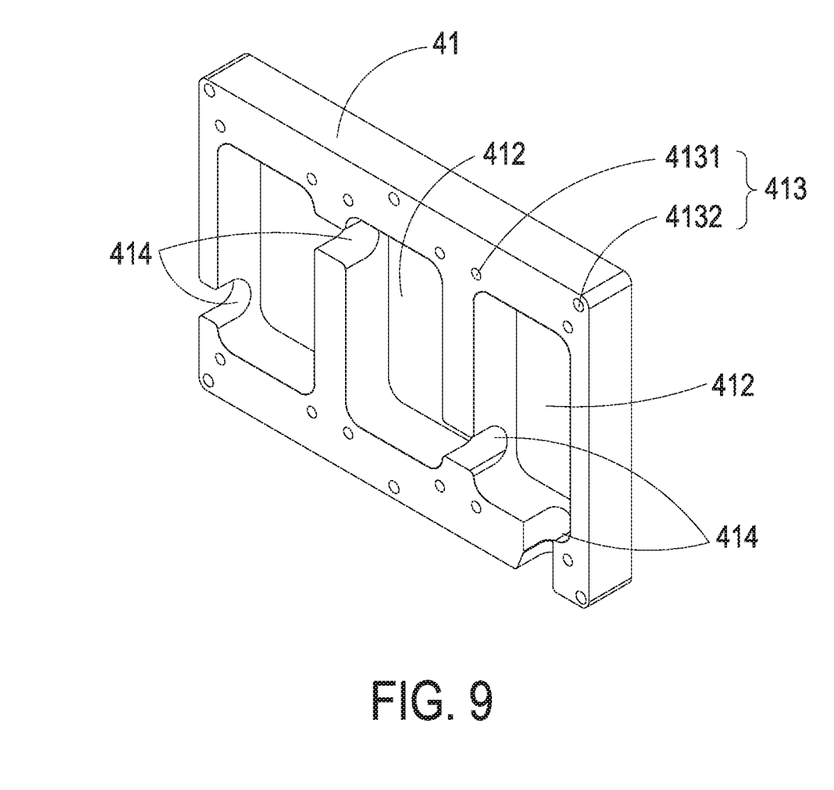
FIG. 9 is a schematic perspective view illustrating the plastic frame of the liquid-cooling-plate assembly of FIG. 8.
Figure 10:
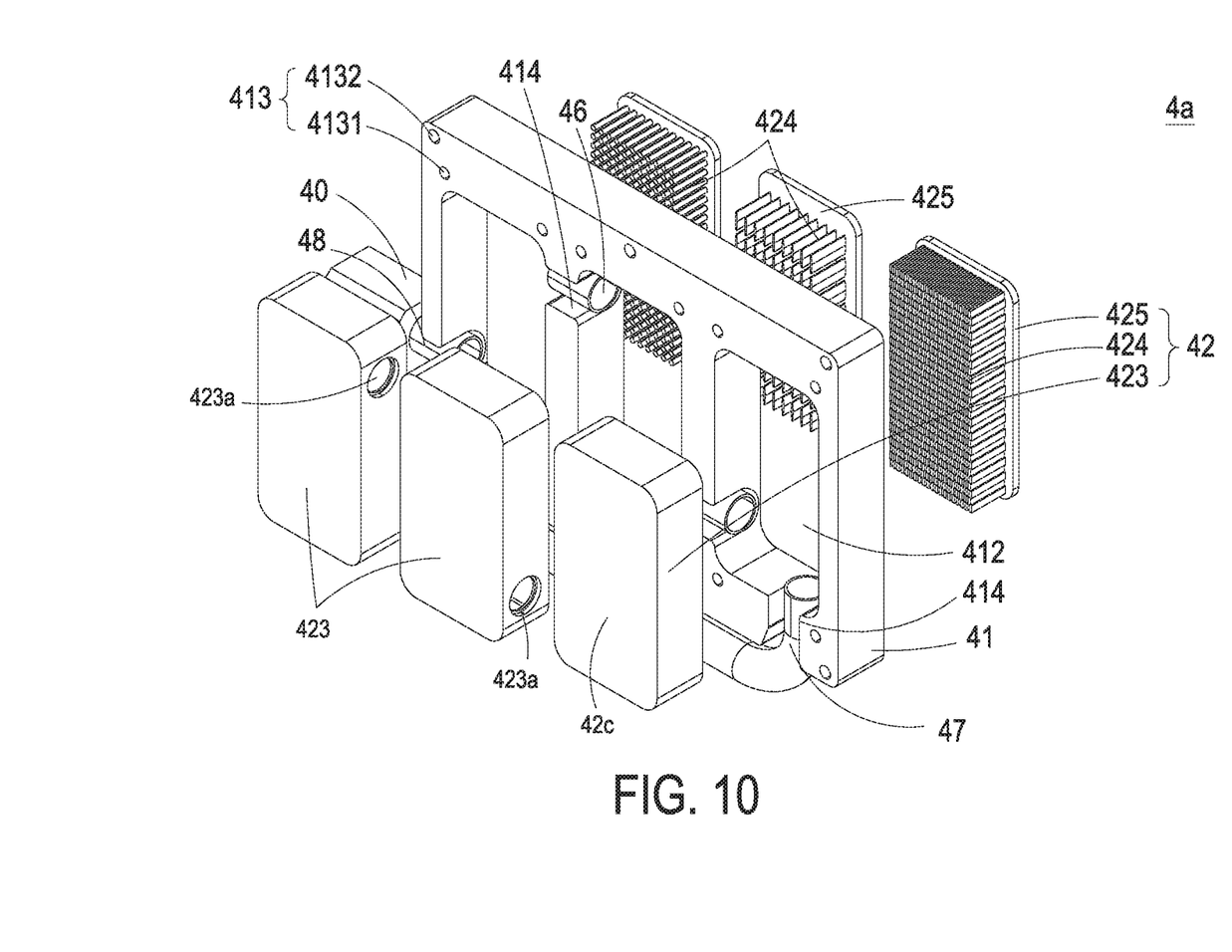
FIG. 10 is an exploded vies illustrating the liquid-cooling-plate assembly of FIG. 8.

FIG. 8 is a schematic perspective view illustrating a liquid-cooling-plate assembly according to a second embodiment of the present invention, FIG. 9 is a schematic perspective view illustrating the plastic frame of the liquid-cooling-plate assembly of FIG. 8, and FIG. 10 is an exploded vies illustrating the liquid-cooling-plate assembly of FIG. 8. As shown in FIGS. 8, 9 and 10, in the embodiment, the structures, elements and functions of the liquid-cooling-plate assembly 4a are similar to those of the liquid-cooling-plate assembly 4 of FIG. 3, and are not redundantly described herein. Different from the liquid-cooling-plate assembly 4 of FIG. 3, the liquid-cooling-plate assembly 4a includes a plastic frame 41, a plastic fastening device 40, a plurality of fluid ducts 46, at least one fluid inlet 47 and at least one fluid outlet 48. The coolant chamber units 42 are communicated with each other through the fluid ducts 46, and communicated with the fluid inlet 47 and the fluid outlet 48 to form at least one internal flow path. The plastic frame 41 further includes a plurality of receiving recesses 414. The accommodation openings 412 of the plastic frame 41 are configured to accommodate the coolant chamber units 42, and the receiving recesses 414 are configured to receive the fluid ducts 46, the fluid inlet 47 and the fluid outlet 48. Portion of the fluid inlet 47 and portion of the fluid outlet 48 exposed out of the plastic frame 41 are fixed by the plastic fastening device 40. In the embodiment, the structures and method of assembling the power semiconductor module (not shown) with the liquid-cooling-plate assembly 4a, and the structures and method of assembling the liquid-cooling-plate assembly 4a and the system board are similar to those of the foregoing embodiments, and are not redundantly described herein.

On the other hand, as shown in FIG. 10, in the embodiment, the coolant chamber unit 42 further includes a case 423, a bottom cover 425, and a plurality of fins 424. The case 423 includes at least one through-hole 423a disposed on a lateral side thereof and configured to communicate with the fluid ducts 46, the fluid inlet 47 and the fluid outlet 48 so as to form the internal flow path. The bottom cover 425 is opposite to and matched with the case 423 to form the surface 42c of the coolant chamber unit 42. The plural fins 424 are disposed between the bottom cover 425 and the case 423 and connected to the surface 42c of the coolant chamber unit 42 so as to increase the heat-exchanging surface area between the coolant chamber unit 42 and the cooling liquid. The profiles of the fins 424 are varied according to the practical requirements. The fins 424 can be for example but not limited to round pin fins, plate fins or wavy fins. In other embodiment, the plural fins 424 are omitted. It is noted that the profiles of the coolant chamber unit 42 is not limited to the foregoing embodiments. The number and the profiles of the fins 424 disposed between the bottom cover 425 and the case 423 are varied according to the practical requirements. The coolant chamber unit 42 can be constructed by the bottom cover 425 and the case 423 merely, and the fins 424 are omitted. In an embodiment, the fluid ducts 46, the fluid inlet 47 and the fluid outlet 48 include the same fins disposed therein. Alternatively, in other embodiment, the coolant chamber units 42 include fins with different profiles and designs.

Figure 11:
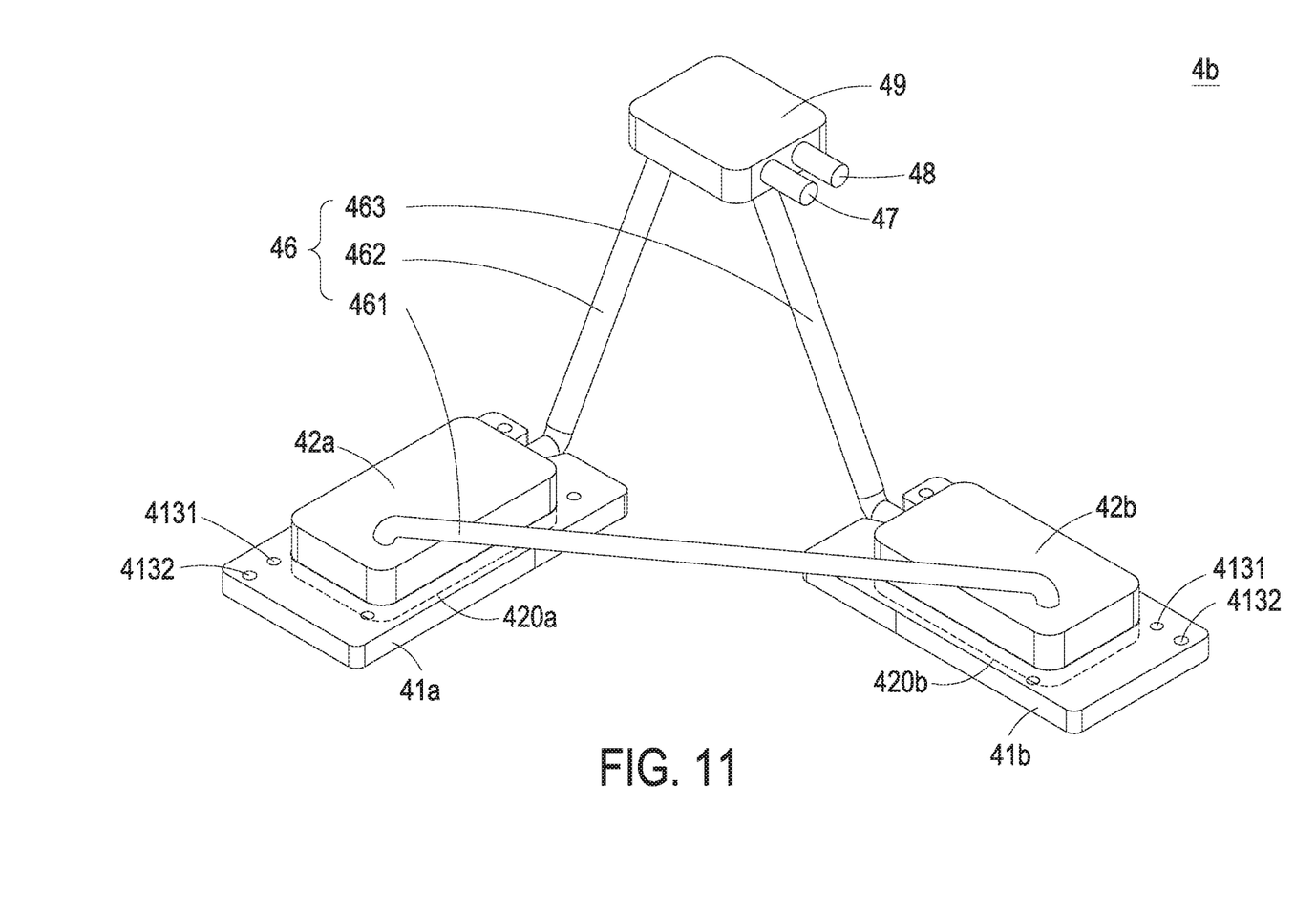
FIG. 11 is a schematic perspective view illustrating a liquid-cooling-plate assembly according to a third embodiment of the present invention.

FIG. 11 is a schematic perspective view illustrating a liquid-cooling-plate assembly according to a third embodiment of the present invention. In the embodiment, the structures, elements and functions of the liquid-cooling-plate assembly 4b are similar to those of the liquid-cooling-plate assembly 4a in FIG. 8, and are not redundantly described herein. Different from the liquid-cooling-plate assembly 4a of FIG. 8, the liquid-cooling-plate assembly 4b includes a first plastic frame 41a, a second plastic frame 41b, a first coolant chamber unit 42a, a second coolant chamber unit 42b, a plurality of fluid ducts 46, a fluid inlet 47, a fluid outlet 48 and a fluid reservoir 49. The structures, elements and functions of the first coolant chamber unit 42a and the second coolant chamber unit 42b are similar to those of the foregoing coolant chamber unit 42, and are not redundantly described herein. The first coolant chamber unit 42a and the second coolant chamber unit 42b are assembled with the first plastic frame 41a and the second plastic frame 41b and embedded in the respective accommodation openings of the first plastic frame 41a and the second plastic frame 41b respectively. The first coolant chamber unit 42a and the second coolant chamber unit 42b are communicated with each other by the first fluid duct 461. The first coolant chamber unit 42a is communicated with the fluid reservoir 49 by the second fluid duct 462. The second coolant chamber unit 42b is communicated with the fluid reservoir 49 by the third fluid duct 463. The fluid inlet 47 and the fluid outlet 48 are communicated with the fluid reservoir 49 and communicated with the second fluid duct 462 and the third fluid duct 463 respectively, so as to form a flow path. In the embodiment, plural power semiconductor modules (not shown) can be mounted on the surfaces 420a and 420b of the first coolant chamber unit 42a and the second coolant chamber unit 42b, respectively. The structures and the method of assembling the power semiconductor modules with the first plastic frame 41a and the second plastic frame 41b are similar to those of the foregoing embodiments, and are not redundantly described herein. In addition, the first coolant chamber unit 42a and the second coolant chamber unit 42b are secured on the system board by the first plastic frame 41a and the second plastic frame 41b respectively. The assembling structures and methods are similar to those of the foregoing embodiments, and are not redundantly described herein. By utilizing the liquid-cooling-plate assembly 4b, it is advantage to accomplish the heat dissipation of electronic devices located at different positions and regions. In other embodiment, the surfaces 420a and 420b of the first coolant chamber unit 42a and the second coolant chamber unit 42b are two planes disposed at different heights and different angles and can be corresponding to different heat sources located at different positions and regions of the heat dissipation system. Since the first coolant chamber unit 42a and the second coolant chamber unit 42b are assembled with the first plastic frame 41a and the second plastic frame 41b respectively, the first plastic frame 41a and the second plastic frame 41b can provide structural support for the first coolant chamber unit 42a and the second coolant chamber unit 42b. In addition, the first coolant chamber unit 42a and the second coolant chamber unit 42b can be fixed on the heat dissipation system in the most compact structure. In the present embodiment, the first plastic frame 41a and the second plastic frame 41b have good processing performance, are varied according to the practical requirements, can be assembled with the first coolant chamber unit 42a and the second coolant chamber unit 42b easily and can accomplish a lightweight heat dissipation system at a low material cost. Certainly, the corresponding numbers and positioning configuration of the first coolant chamber unit 42a, the second coolant chamber unit 42b, the first plastic frame 41a and the second plastic frame 41b of the liquid-cooling-plate assembly 4b are varied according to the practical requirements.

In summary, the present disclosure provides a lightweight liquid-cooling-plate assembly having a plastic frame and a heat dissipation system using the same liquid-cooling-plate assembly. The plastic frame is combined with at least one coolant chamber unit to form the liquid-cooling-plate assembly, so as to provide sufficient mechanical strength for supporting the coolant chamber unit. In addition, the power semiconductor devices can be secured on the liquid-cooling-plate assembly, or the liquid-cooling-plate assembly can be assembled with a system board so as to achieve the purpose of cooling and lightweight. In addition, the plastic frame is preformed and then assembled with the coolant chamber unit, or the plastic frame body can be formed and combined with the coolant chamber unit directly by means of injection molding or matrix transfer molding, so that the liquid-cooling-plate assembly is lightened, has lower material cost, and can be assembled easily. The production rate is increased, and the assembly cost is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A liquid-cooling-plate assembly comprising:
   a plastic frame including a plurality of lateral walls, at least one accommodation opening, and a plurality of fastening elements, wherein the lateral walls are connected with each other to form and define the at least one accommodation opening, and the fastening elements are disposed on a part of the lateral walls, wherein the lateral walls of the plastic frame comprises a first lateral wall and a second lateral wall, and the first lateral wall is opposite to the second lateral wall, wherein the first lateral wall of the plastic frame comprises an outer side including a plurality of first position recesses, and the second lateral wall of the plastic frame comprises an outer side including a plurality of second position recesses, wherein the first position recesses are aligned with the second position recesses; and
   at least one coolant chamber unit connected with the plastic frame, embedded in the at least one accommodation opening, and including at least one surface exposed.

2. The liquid-cooling-plate assembly according to claim 1, wherein the plastic frame is connected with the coolant chamber unit by an adhesive layer.

3. The liquid-cooling-plate assembly according to claim 1, wherein the plastic frame is directly connected with the coolant chamber unit.

4. The liquid-cooling plate assembly according to claim 1, wherein the lateral walls of the plastic frame comprises a third lateral wall and a fourth lateral wall, wherein the third lateral wall is opposite to the fourth lateral wall, the first lateral wall includes two ends connected with the third lateral wall and the fourth lateral wall respectively, and the second lateral wall includes two ends connected with the third lateral wall and the fourth lateral wall respectively, wherein the fastening elements are embedded in the first lateral wall and the second lateral wall of the plastic frame.

5. The liquid-cooling-plate assembly according to claim 4, wherein the number and the position distribution of the fastening elements disposed on the first lateral wall are corresponding to the number and the position distribution of the fastening elements disposed on the second lateral wall.

6. The liquid-cooling plate assembly according to claim 4, wherein each of the fastening elements includes a screw hole passing through two opposite edges of the first lateral wall or two opposite edges of the second lateral wall.

7. The liquid-cooling plate assembly according to claim 1, wherein the fastening elements comprises a plurality of first fastening elements and a plurality of second fastening elements, wherein the first fastening elements are configured to engage with a plurality of first securing elements for securing at least one power semiconductor module on the liquid-cooling-plate assembly and allowing the at least one power semiconductor module to be attached on the at least one surface of the at least one coolant chamber unit, wherein the second fastening elements are configured to engage with a plurality of second securing elements for securing the liquid-cooling plate assembly on a system board.

8. The liquid-cooling plate assembly according to claim 1, wherein the at least one coolant chamber unit comprises a plurality of coolant chamber units, and the liquid-cooling plate assembly further comprises a plastic fastening device, a plurality of fluid ducts, at least one fluid inlet and at least one fluid outlet, wherein the coolant chamber units are communicated with each other through the fluid ducts and communicated between the fluid inlet and the fluid outlet, wherein the plastic frame comprises a plurality of receiving recesses to receive the fluid ducts, the at least one fluid inlet and the at least one fluid outlet, wherein the plastic fastening device is configured to fix portions of the fluid inlet and the fluid outlet exposed out of the plastic frame.

9. The liquid-cooling plate assembly according to claim 1, wherein the at least one coolant chamber unit comprises a first coolant chamber unit and a second coolant chamber unit, and the liquid-cooling plate assembly further comprises an additional plastic frame, a plurality of fluid ducts, at least one fluid inlet, at least one fluid outlet, and a fluid reservoir, wherein the first coolant chamber unit and the second coolant chamber unit are assembled with the plastic frame and the additional plastic frame respectively, and embedded in the plastic frame and the additional plastic frame respectively, wherein the first coolant chamber unit, the second coolant chamber unit and the fluid reservoir are communicated with each other through the fluid ducts, and the fluid inlet and the fluid outlet are communicated with the fluid reservoir respectively, wherein the first coolant chamber unit and the second coolant chamber unit include surfaces exposed on the plastic frame and the additional plastic frame respectively.

10. The liquid-cooling-plate assembly according to claim 1, wherein the at least one coolant chamber unit comprises:
    a case including at least one through-hole disposed on a lateral side thereof;
    a bottom cover opposite to the case, connected with the case and including at least one surface; and a plurality of fins disposed between the case and the bottom cover and connected to the at least one surface.

11. The liquid-cooling-plate assembly according to claim 10, wherein the fins are round pin fins, plate fins or wavy fins.

12. A heat dissipation system comprising:
a liquid-cooling-plate assembly comprising:
  a plastic frame including a plurality of lateral walls, at least one accommodation opening, and a plurality of fastening elements, wherein the lateral walls are connected with each other to form and define the at least one accommodation opening, and the fastening elements are disposed on a part of the lateral walls, wherein the lateral walls of the plastic frame comprises a first lateral wall and a second lateral wall, and the first lateral wall is opposite to the second lateral wall, wherein the first lateral wall of the plastic frame comprises an outer side including a plurality of first position recesses, and the second lateral wall of the plastic frame comprises an outer side including a plurality of second position recesses, wherein the first position recesses are aligned with the second position recesses; and
  at least one coolant chamber unit connected with the plastic frame, embedded in the at least one accommodation opening, and including at least one surface exposed;
at least one power semiconductor module secured to the plastic frame by engaging a plurality of first securing elements with portions of the fastening elements, wherein the at least one power semiconductor module is attached on the at least one surface of the coolant chamber unit; and
a system board assembled with the liquid-cooling-plate assembly by engaging a plurality of second securing elements with the other portions of the fastening elements.

13. The heat dissipation system according to claim 12, wherein the plastic frame is connected with the coolant chamber unit by an adhesive layer.

14. The heat dissipation system according to claim 12, wherein the plastic frame is directly connected with the coolant chamber unit.

15. The heat dissipation system according to claim 12, wherein the lateral walls of the plastic frame comprises a third lateral wall and a fourth lateral wall, wherein the third lateral wall is opposite to the fourth lateral wall, the first lateral wall includes two ends connected with the third lateral wall and the fourth lateral wall respectively, and the second lateral wall includes two ends connected with the third lateral wall and the fourth lateral wall respectively, wherein the fastening elements are embedded in the first lateral wall and the second lateral wall of the plastic frame.

16. The heat dissipation system according to claim 15, wherein the number and the position distribution of the fastening elements disposed on the first lateral wall are corresponding to the number and the position distribution of the fastening elements disposed on the second lateral wall.

17. The heat dissipation system according to claim 12, wherein the fastening elements comprises a plurality of first fastening elements and a plurality of second fastening elements, wherein the first fastening elements are configured to engage with the first securing elements for securing the at least one power semiconductor module on the liquid-cooling plate and allowing the at least one power semiconductor module to be attached on the at least one surface of the coolant chamber unit of the liquid-cooling plate assembly, wherein the second fastening elements are configured to engage with the second securing elements for securing the liquid-cooling plate assembly to the system board.

18. The heat dissipation system according to claim 15, wherein the power semiconductor module comprises a carrier and at least one power semiconductor device, the at least one power semiconductor device is disposed on the carrier, and the carrier includes a first position protrusion and a second position protrusion, wherein the first position recesses are configured to match with the first position protrusion, and the second position recesses are configured to match with the second position protrusion.

* * * * *